United States Patent [19]
Ahmed

[11] 4,223,281
[45] Sep. 16, 1980

[54] SCR RELAXATION OSCILLATOR WITH CURRENT AMPLIFIER IN ITS GATE CIRCUIT

[75] Inventor: Adel A. A. Ahmed, Clinton Township, Hunterdon County, N.J.

[73] Assignee: RCA Corporation, New York, N.Y.

[21] Appl. No.: 4,847

[22] Filed: Jan. 19, 1979

[51] Int. Cl.³ .................. H03K 3/82; H03K 3/352
[52] U.S. Cl. .................. 331/111; 307/252 R
[58] Field of Search .................. 331/111, 107 R, 143; 332/16 T, 14; 307/252 B, 252 F, 252 R

[56] References Cited
U.S. PATENT DOCUMENTS

| 3,887,884 | 6/1975 | Suzuki | 331/111 |
| 3,916,343 | 10/1975 | Suzuki | 331/111 |
| 4,001,723 | 1/1977 | Sheng et al. | 331/111 |

*Primary Examiner*—Siegfried H. Grimm
*Attorney, Agent, or Firm*—Paul J. Rasmussen; Allen LeRoy Limberg; John M. O'Meara

[57] ABSTRACT

Within a relaxation oscillator of the type having a capacitor that is recurrently being charged from a current source and then discharged through a silicon controlled rectifier upon reaching a voltage threshold thereacross, the current flow to the gate of the SCR is amplified relative to that being supplied by the current source when the threshold voltage level is reached across the capacitor.

10 Claims, 2 Drawing Figures

PRIOR ART

SCR RELAXATION OSCILLATOR WITH CURRENT AMPLIFIER IN ITS GATE CIRCUIT

The present invention relates to an oscillator circuit of the type wherein a capacitor is recurrently charged from a current source and then discharged through a silicon controlled rectifier (SCR) upon reaching a threshold voltage thereacross.

Although relaxation oscillators of this type are well known in the art, such oscillators are operationally restricted. The magnitude of the current source must reach the firing current level required to render the SCR conductive when the capacitor is to be discharged during each oscillation cycle. When the capacitor has been discharged, however, the SCR must become non-conductive and therefore, its holding current characteristic must not be exceeded by the magnitude of the current source. Generally, there is little difference between the firing current and the holding current characteristics of the SCR. Consequently, the magnitude of the current source is restricted to a narrow range, particularly when allowance is made for tolerance to consider normal variations in the characteristics of the SCR. Because of this narrow range, the value of the capacitor must essentially be selected in accordance with the oscillation frequency desired, rather than in accordance with other practical considerations. For example, at high operating frequencies it may be desirable to use a capacitor of sufficiently large value to swamp out the effects of stray capacitance. Where a resistor is connected from a supply voltage rail as the current source, another problem is also presented by the small difference between the firing current and holding current characteristics of the SCR. This problem arises because the available voltage drop across the resistor is low when a large current is desired to render the SCR conductive but high when a small current is desired to render the SCR non-conductive. Such conflicting voltage drop conditions operate to restrict the permissible oscillation amplitude.

The relaxation oscillator of this invention overcomes such operational restrictions by amplifying current flow to the gate of the SCR relative to the magnitude of the current source when the threshold voltage is reached across the capacitor. In one preferred embodiment, the current amplifcation is accomplished through a bipolar transistor having its main conduction path disposed to conduct current from a supply voltage rail to the gate of the SCR when the voltage threshold is reached across the capacitor.

Figure 1:
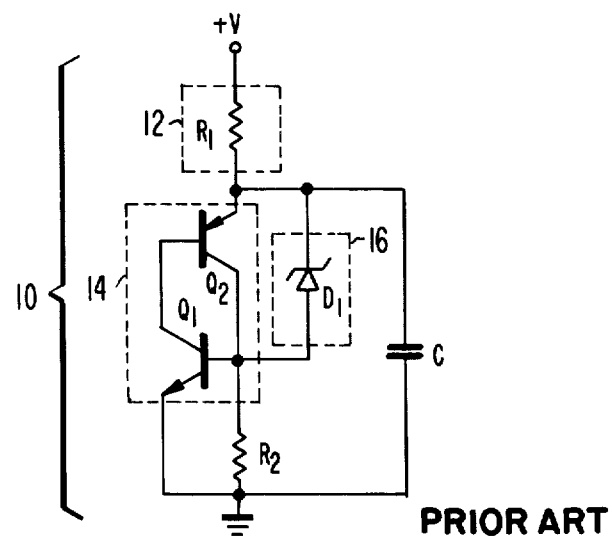
FIG. 1 is a schematic of a prior art relaxation oscillator.

The prior art relaxation oscillator 10 of FIG. 1 includes a capacitor C which is recurrently charged from a supply voltage rail +V through a current source 12 and then discharged through an SCR 14 upon reaching a threshold voltage thereacross. Of course, the voltage across C is proportional to the level of charge stored therein as stated by Coulomb's Law. A resistor $R_1$ is connected from +V as the current source 12, while bipolar transistors $Q_1$ and $Q_2$ of complementary types are connected in a conventional manner as the SCR 14. The positive gate of SCR 14 at the base of $Q_1$ is connected to the interconnection between the current source 12 and C through means 16 for offsetting voltage. The gate of the SCR 14 is also connected through a resistor $R_2$ to a reference voltage rail such as ground. Where a negative supply voltage rail is more convenient, the negative gate of the SCR at the base of $Q_2$ may be utilized and the SCR 14 is then commonly known as a programmable unijunction transistor or silicon controlled switch (see U.S. Pat. No. 4,001,723). Many circuit components, such as an avalanche diode $D_1$ could be utilized for the voltage offsetting means 16.

During each oscillation cycle, charge is first supplied to C by the current source 12 until the threshold voltage level thereacross is reached when forward bias is applied to the base-emitter junction of $Q_1$, which functions as the gate control junction of the SCR 14. Therefore, the threshold voltage level of C is equal to the forward bias base-emitter junction voltage of $Q_1$ plus the avalanche voltage level of $D_1$ within the voltage offsetting means 16 which of course can be adjusted to adjust the threshold voltage level. Latching current is then drawn through the main conduction path of $Q_2$, so that $Q_1$ becomes sufficiently conductive to pull down the base of $Q_2$ and thereby establish the regenerative loop necessary to render the SCR 14 conductive across C. Thereafter, C discharges until the current being drawn down through the main conduction path of $Q_2$ falls below the holding level necessary to maintain conduction about the regenerative loop. Consequently the SCR 14 becomes substantially non-conductive and charge is once again directed to C by the current source 12 to commence another oscillation cycle. Because the current drawn through $R_2$ increases both the firing and holding current characteristics, $R_2$ can be selected to set either of these characteristics. However, there will continue to be little difference between the firing current and holding current characteristics so that the magnitude of the current source 12 continues to be limited by these characteristics. Therefore, the frequency attainable from the relaxation oscillator 10 is substantially determined by the value of C which may present the difficulties discussed previously.

Figure 2:
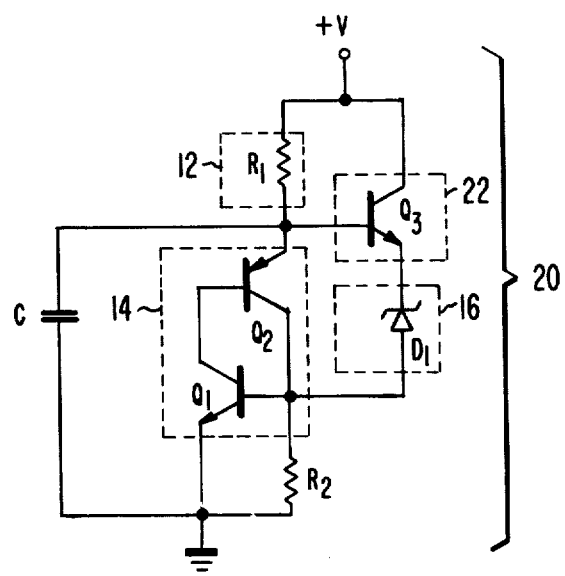
FIG. 2 is the block diagram for the relaxation oscillator of the invention, and also the schematic diagram for the preferred embodiments thereof.

The relaxation oscillator 20 of this invention is shown in the block diagram of FIG. 2 wherein the current source 12, the SCR 14, the voltage offsetting means 16, the resistor $R_2$ and the capacitor C from the relaxation oscillator 10 of FIG. 1 are again utilized. A means 22 is included for amplifying current flow to the gate of the SCR 14 relative to that supplied by the current source 12 when the threshold voltage level is reached across C. Relaxation oscillator 20 operates in the same manner as the relaxation oscillator 10 of FIG. 1, except that the magnitude of $R_2$ is selected to set the holding current characteristics of the SCR 14 above the magnitude of the current source 12. Therefore, when the threshold voltage level is reached across C, trigger current is supplied by the current amplifying means 22 to render the SCR 14 conductive and when C is discharged below the threshold voltage level, less than the holding current is supplied by the current source 12 to render the SCR 14 non-conductive.

Although many embodiments of the current amplifying means 22 are possible, FIG. 2 shows one preferred embodiment thereof which includes a bipolar transistor $Q_3$ having the voltage level across the capacitor applied to its base and having its main conduction path connected between +V and the gate of the SCR through the voltage offsetting means 16. The relaxation oscillator 20 then operates with the main conduction path of $Q_3$ being controlled in response to the threshold voltage level being attained across C. During each oscillation cycle, $Q_3$ becomes conductive to forward bias the gate control junction of SCR 14 and supply trigger current thereto when the threshold voltage level is reached. Because of $Q_3$, however, the threshold voltage level is equal to the sum of the forward bias base-emitter junction voltages of $Q_1$ and $Q_3$ plus the avalanche voltage level of $D_1$ in the voltage offsetting means 16, while the available level of trigger current is equal to the magnitude of the current source 12 multiplied by the common-emitter forward gain (Beta) of $Q_3$. This renders SCR 14 conductive until its holding current requirement is not sustained by the sum of the discharge current from C and the magnitude of the current source 12. Then SCR 14 is rendered non-conductive and the current source 12 starts to charge C again to commence another oscillation cycle. Consequently, the value of $R_2$ may be selected to elevate both the firing current and holding current characteristics of SCR 14 and thereby alleviate the restrictions imposed on the magnitude of the current source 12 by prior art circuitry.

Those skilled in the art will realize without further explanation that circuit components other than $Q_3$ could be utilized as the current amplifying means 22, such as a field effect transistor or a Darlington arrangement of transistors. Furthermore, the voltage offsetting means 16 could be disposed between the interconnection of the current source 12 with C and the base of $Q_3$ in the relaxation oscillator 20 of the invention. Therefore, this invention has been disclosed herein by describing only a few embodiments thereof, so that numerous changes in the details of construction and the combination or arrangement of parts could be made on the described embodiments without departing from the true scope and spirit of the invention. Consequently, the present disclosure should be construed as illustrative rather than limiting.

What I claim is:

1. In a relaxation oscillator of the type wherein a capacitor has a first plate connected to a reference voltage rail and has a second plate connected to a supply voltage rail through a current source, and wherein the main conduction path of an SCR is connected across the capacitor, which capacitor is recurrently charged by the current source and then discharged through the SCR when its gate electrode is forward biased responsive to the voltage across the capacitor reaching a threshold level, the improvement comprising:
   current amplifier means with input connection from the second plate of the capacitor and with output connection to the gate electrode of the SCR responsive to the threshold voltage level being reached across the capacitor for supplying current flow to the gate electrode of the SCR.

2. The relaxation oscillator of claim 1 wherein the current amplifier means includes a bipolar transistor having a base-emitter junction, having a base electrode to which the voltage level at the second plate of the capacitor is applied, having a collector electrode connected to said supply voltage rail, and having an emitter electrode connected to the gate electrode of the SCR.

3. The relaxation oscillator of claim 1 or 2 wherein a resistor is connected between the gate electrode of the SCR and the first plate of the capacitor to increase the holding current characteristic of the SCR.

4. The relaxation oscillator of claim 2 wherein means for offsetting voltage is serially connected with the base-emitter junction of said bipolar transistor between the second plate of the capacitor and the gate electrode of the SCR to increase the threshold voltage level attained by the capacitor during each oscillation cycle.

5. The relaxation oscillator of claim 4 wherein said voltage offsetting means includes an avalanche diode.

6. The relaxation oscillator of claim 2 wherein means for offsetting voltage is connected between the emitter electrode of the bipolar transistor and the gate electrode of the SCR to increase the threshold voltage level attained by the capacitor during each oscillation cycle.

7. The relaxation oscillator of claim 6 wherein said voltage offsetting means includes an avalanche diode.

8. In a relaxation oscillator including
   a capacitor having a first plate connected to a reference voltage rail, and having a second plate,
   current supply means connected for applying current to the second plate of the capacitor for changing the potential thereacross in a first direction,
   an SCR having its main conduction path connected between the first and second plates of the capacitor, and having a gate electrode, the SCR connected for withdrawing current from the capacitor for changing the potential thereacross in a second direction when the gate electrode of the SCR is forward biased responsive to the potential across the capacitor reaching a threshold voltage level,
   the improvement comprising:
   a transistor having first, second and control electrodes, and a main-conduction path between its first and second electrodes responsive to signals applied between its first and control electrodes;
   means for applying the potential at the second plate of the capacitor to the control electrode of said transistor; and
   means for connecting the main-conduction path of said transistor between a supply voltage rail and the gate electrode of the SCR for forward biasing the gate electrode of the SCR when the potential across the capacitor reaches the threshold voltage level.

9. The relaxation oscillator of claim 8 wherein said means for connecting includes voltage offsetting means connected between the main-conduction path of said transistor and the gate electrode of the SCR.

10. The relaxation oscillator of claim 9 wherein said voltage offsetting means is an avalanche diode.

* * * * *